(12) United States Patent
Joshi et al.

(10) Patent No.: US 10,794,642 B2
(45) Date of Patent: Oct. 6, 2020

(54) LOW TEMPERATURE SINTERING POROUS METAL FOAM LAYERS FOR ENHANCED COOLING AND PROCESSES FOR FORMING THEREOF

(71) Applicant: Toyota Motor Engineering & Manufacturing North America, Inc., Erlanger, KY (US)

(72) Inventors: Shailesh N. Joshi, Ann Arbor, MI (US); Yanghe Liu, Ann Arbor, MI (US)

(73) Assignee: Toyota Motor Engineering & Manufacturing North America, Inc., Plano, TX (US)

(*) Notice: Subject to any disclaimer, the term of this patent is extended or adjusted under 35 U.S.C. 154(b) by 244 days.

(21) Appl. No.: 15/700,749

(22) Filed: Sep. 11, 2017

(65) Prior Publication Data
US 2019/0078847 A1  Mar. 14, 2019

(51) Int. Cl.
*F28F 13/18* (2006.01)
*B22F 3/11* (2006.01)
(Continued)

(52) U.S. Cl.
CPC .............. *F28F 13/187* (2013.01); *B22F 3/11* (2013.01); *B22F 7/004* (2013.01); *F28D 15/0266* (2013.01); *F28F 13/003* (2013.01); *B22F 3/1035* (2013.01); *B22F 3/1121* (2013.01); *B22F 7/04* (2013.01); *B22F 7/08* (2013.01); *B22F 2007/047* (2013.01); *B22F 2998/10* (2013.01); *B22F 2999/00* (2013.01); *F28F 2260/02* (2013.01)

(58) Field of Classification Search
CPC ........... F28F 13/187; B22F 3/11; B22F 7/004; F28D 15/0266
USPC ........................................................ 165/133
See application file for complete search history.

(56) References Cited

U.S. PATENT DOCUMENTS 5,922,397 A      7/1999  Brandt et al.
9,343,425 B1 *   5/2016  Joshi ...................... H01L 24/83
                         (Continued)

FOREIGN PATENT DOCUMENTS

CN      103273217 B      1/2016
CN      106216873 A     12/2016
(Continued)

*Primary Examiner* — Paul Alvare
(74) *Attorney, Agent, or Firm* — Dinsmore & Shohl LLP

(57) ABSTRACT

A heat transfer surface with a convective cooling layer includes a metal substrate and a porous metal foam layer transient liquid phase (TLP) bonded on the metal substrate. The porous metal foam layer includes a plurality of high melting temperature (HMT) particles and a plurality of micro-channels. A first TLP intermetallic layer is positioned between, and TLP bonds together, adjacent HMT particles to form the porous metal foam layer. A second TLP intermetallic layer is positioned between and TLP bonds a subset of the plurality of HMT particles to the metal substrate such that the porous metal foam layer is TLP bonded to the metal substrate. The plurality of micro-channels extend from an outer surface of the porous metal foam layer to the metal substrate such that a cooling fluid may be wicked through the plurality of micro-channels to the surface of the metal substrate.

15 Claims, 6 Drawing Sheets

(51) Int. Cl.
  *F28D 15/02* (2006.01)
  *B22F 7/00* (2006.01)
  *F28F 13/00* (2006.01)
  *B22F 3/10* (2006.01)
  *B22F 7/08* (2006.01)
  *B22F 7/04* (2006.01)

(56) References Cited

U.S. PATENT DOCUMENTS

| | | |
|---|---|---|
| 9,472,342 B2 | 10/2016 | McConnell et al. |
| 2010/0132404 A1 | 6/2010 | Shuja |
| 2013/0313309 A1 | 11/2013 | Kitajima et al. |
| 2015/0137412 A1* | 5/2015 | Schalansky ........... B22F 3/1055 264/129 |
| 2016/0108204 A1* | 4/2016 | Joshi ....................... C08K 3/08 428/557 |
| 2016/0129530 A1 | 5/2016 | Greve et al. |
| 2017/0080493 A1* | 3/2017 | Joshi .................... B22F 3/1035 |
| 2018/0128554 A1* | 5/2018 | Washizuka ............ F28D 15/046 |

FOREIGN PATENT DOCUMENTS

| | | | |
|---|---|---|---|
| WO | 2008091825 A2 | 7/2008 | |
| WO | WO-2017056842 A1 * | 4/2017 | ........... F28D 15/046 |

\* cited by examiner

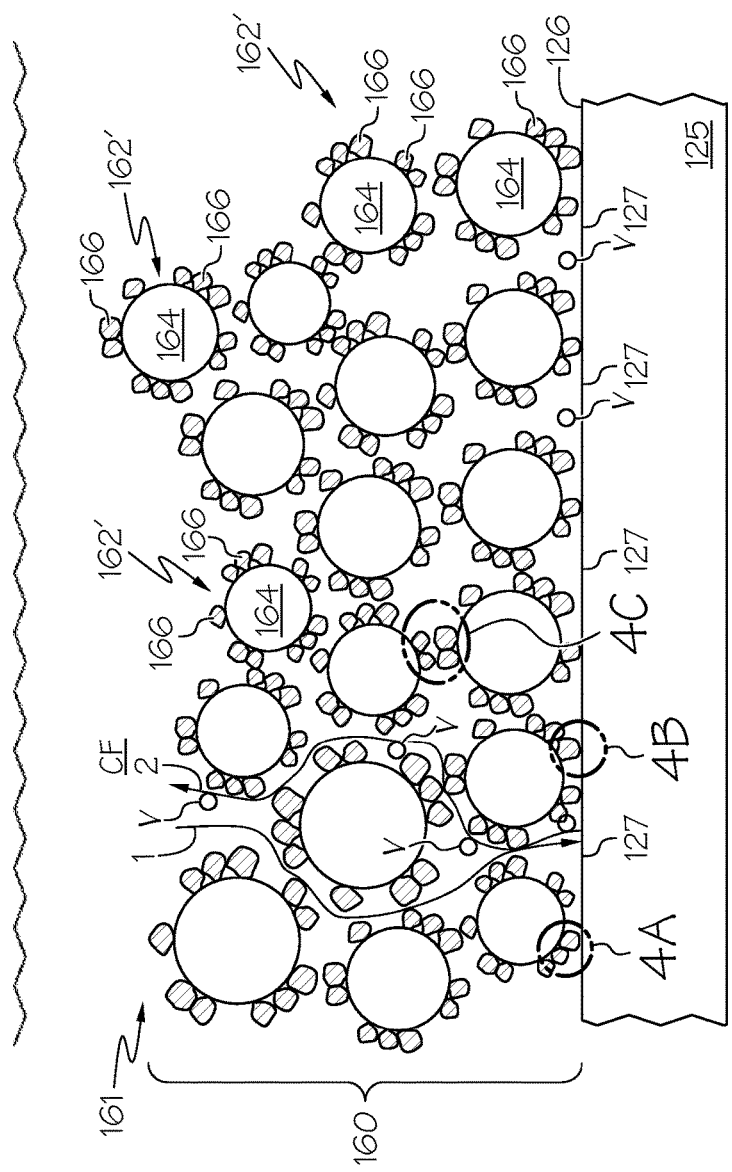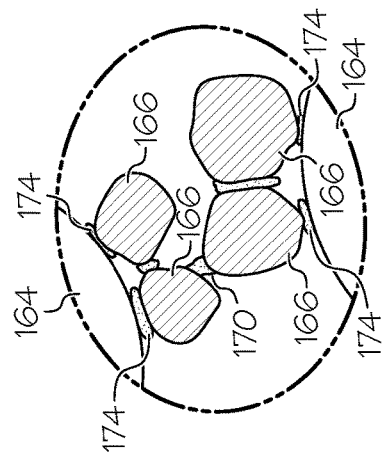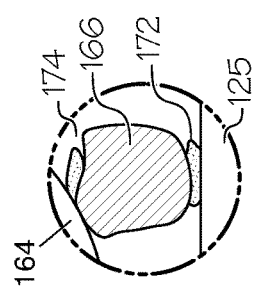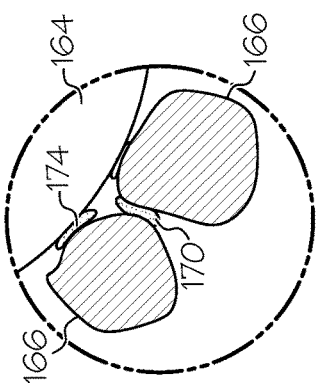

LOW TEMPERATURE SINTERING POROUS METAL FOAM LAYERS FOR ENHANCED COOLING AND PROCESSES FOR FORMING THEREOF

TECHNICAL FIELD

The present specification generally relates to cooling apparatuses for cooling heat generating devices and, more particularly, to cooling apparatuses having a porous metal foam layer for convective cooling of heat generating devices.

BACKGROUND

Heat generating devices, such as power semiconductor devices, may be coupled to a cold plate to remove heat and lower the maximum operating temperature of the heat generating device. In some applications, cooling fluid may be used to receive heat generated by the heat generating device by convective thermal transfer from a heat transfer surface, and remove such heat from the heat generating device. Porous metal layers in the form of copper inverse opal (CIO) layers have been proposed to enhance the flow of cooling fluid to heat transfer surfaces thereby enhancing the removal of heat from heat generating devices. However, fabrication of CIO layers and bonding of such layers to heat transfer surfaces may be cost prohibitive.

SUMMARY

In one embodiment, a heat transfer surface with a convective cooling layer includes a metal substrate and a porous metal foam layer transient liquid phase (TLP) bonded on the metal substrate. The porous metal foam layer includes a plurality of high melting temperature (HMT) particles and a plurality of micro-channels. A first TLP intermetallic layer is positioned between, and TLP bonds together, adjacent HMT particles to form the porous metal foam layer. A second TLP intermetallic layer is positioned between and TLP bonds a subset of the plurality of HMT particles to the metal substrate such that the porous metal foam layer is TLP bonded to the metal substrate. The plurality of micro-channels extend from an outer surface of the porous metal foam layer to the metal substrate such that a cooling fluid may be wicked through the plurality of micro-channels to the surface of the metal substrate. Also, the heat transfer surface may include a plurality of micro-boiling nucleation sites between the subset of the HMT particles TLP bonded to the metal substrate such that vapor formed at the micro-boiling nucleation sites can flow from the heat transfer to the outer surface of the porous metal foam layer.

In some embodiments, the plurality of HMT particles include a plurality of first HMT particles coated with a plurality of second HMT particles. The plurality of first HMT particles may be formed from a first HMT material and the plurality of second HMT particles may be formed from a second HMT material that is different than the first HMT material. In such embodiments, a third TLP intermetallic layer may be positioned between and TLP bond the plurality of second HMT particles to the plurality of first HMT particles. The plurality of first HMT particles may be formed from copper, nickel, silver, aluminum or alloys thereof; the plurality of second HMT particles may be formed from nickel, silver or alloys thereof; and the LMT particles may be formed from tin, indium or alloys thereof. The porous metal foam layer may have a concentration of tin between about 20 wt % and 40 wt %, and the first TLP intermetallic layer, the second TLP intermetallic layer, and the third TLP intermetallic layer may include an intermetallic of tin. In other embodiments, the plurality of HMT particles include a plurality of core-shell particles with a core formed from the first HMT material and the shell formed from the second HMT material.

In another embodiment, a heat exchanger includes a cold plate in contact with a heat source and a cooling fluid flowing through the cold plate. The cold plate includes a metal substrate through which heat flows from the heat source to the cold plate. A porous metal foam layer is TLP bonded on the metal substrate. The porous metal foam layer includes a plurality of HMT particles and a plurality of micro-channels. A first TLP intermetallic layer is positioned between, and TLP bonds together, adjacent HMT particles to form the porous metal foam layer and a second TLP intermetallic layer is positioned between and TLP bonds a subset of the plurality of HMT particles to the metal substrate such that the porous metal foam layer is TLP bonded to the metal substrate. The plurality of micro-channels extend from an outer surface of the porous metal foam layer to the metal substrate such that cooling fluid is wicked through the plurality of micro-channels to the surface of the metal substrate. In some embodiments, the plurality of HMT particles include a plurality of first HMT particles coated with a plurality of second HMT particles. The plurality of first HMT particles may be formed from a first HMT material and the plurality of second HMT particles may be formed from a second HMT material that is different than the first HMT material. In such embodiments, a third TLP intermetallic layer may be positioned between and TLP bond the plurality of second HMT particles to the plurality of first HMT particles. The plurality of first HMT particles may be formed from copper, nickel, silver, aluminum or alloys thereof; the plurality of second HMT particles may be formed from nickel, silver or alloys thereof; and the LMT particles may be formed from tin, indium or alloys thereof. The porous metal foam layer may have a concentration of tin between about 20 wt % and 40 wt %, and the first TLP intermetallic layer, the second TLP intermetallic layer and the third TLP intermetallic layer may include an intermetallic of tin. In other embodiments, the plurality of HMT particles include a plurality of core-shell particles with a core formed from the first HMT material and the shell formed from the second HMT material.

In still another embodiment, a process for forming a convective cooling layer on a heat transfer surface includes applying a layer of a TLP bonding paste onto a metal substrate. The TLP bonding paste includes a plurality of first HMT particles coated with a second HMT material and an LMT material. The metal substrate and TLP bonding paste are heated to a TLP sintering temperature and the LMT material at least partially melts and forms a first TLP intermetallic layer between adjacent first HMT particles to form a porous metal foam layer. Also, the melted LMT material forms a second TLP intermetallic layer between a subset of the plurality of first HMT particles and the metal substrate to TLP bond the porous metal foam layer to the metal substrate. The porous metal foam layer TLP bonded to the metal substrate includes a plurality of micro-channels extending from an outer surface of the porous metal foam layer to the metal substrate such that a cooling fluid is wicked from the outer surface of the porous metal foam layer to the metal substrate through the micro-channels. In some embodiments, the plurality of HMT particles include a plurality of first HMT particles coated with a plurality of second HMT particles. The plurality of first HMT particles may be formed from a first HMT material and the plurality of second HMT particles may be formed from a second HMT material that is different than the first HMT material. In such embodiments, a third TLP intermetallic layer may be positioned between and TLP bond the plurality of second HMT particles to the plurality of first HMT particles. The plurality of first HMT particles may be formed from copper, nickel, silver, aluminum or alloys thereof; the plurality of second HMT particles may be formed from nickel, silver or alloys thereof; and the LMT particles may be formed from tin, indium or alloys thereof. The porous metal foam layer may have a concentration of tin between about 20 wt % and 40 wt %, and the first TLP intermetallic layer, the second TLP intermetallic layer and the third TLP intermetallic layer may include an intermetallic of tin. In other embodiments, the plurality of HMT particles include a plurality of core-shell particles with a core formed from the first HMT material and the shell formed from the second HMT material.

These and additional features provided by the embodiments described herein will be more fully understood in view of the following detailed description in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 4 schematically depicts a porous metal foam layer formed from the plurality of composite particles in FIG. 3 with the porous metal foam layer TLP bonded to the heat transfer surface in FIG. 1;

FIG. 4A schematically depicts an enlarged view of section 4A in FIG. 4;

FIG. 4B schematically depicts an enlarged view of section 4B in FIG. 4;

FIG. 4C schematically depicts an enlarged view of section 4C in FIG. 4;

DETAILED DESCRIPTION

Embodiments of the present disclosure are directed to convective cooling apparatuses that may be utilized to cool heat generating devices, such as semiconductor devices. In the embodiments described herein, convective cooling is provided by the flow of cooling fluid through a porous metal foam layer bonded to a heat transfer surface which may be a surface of a heat generating device or a surface of a thermally conductive cold plate coupled to the heat generating device. Heat is transferred to the coolant fluid as it flows from an outer surface of the porous metal foam layer to the heat transfer surface. In some embodiments, two-phase cooling wherein the coolant fluid changes phase from a liquid to a vapor may be enhanced by the porous metal foam layer. Particularly, the heat transfer surface may include micro-boiling nucleation sites and vapor formed at the micro-boiling nucleation sites flows from the heat transfer surface to the outer surface of the porous metal foam layer through the micro-channels. In embodiments, the porous metal foam layer is formed via a low temperature sintering process, e.g., A low temperature transient liquid phase (TLP) sintering process.

Figure 1:
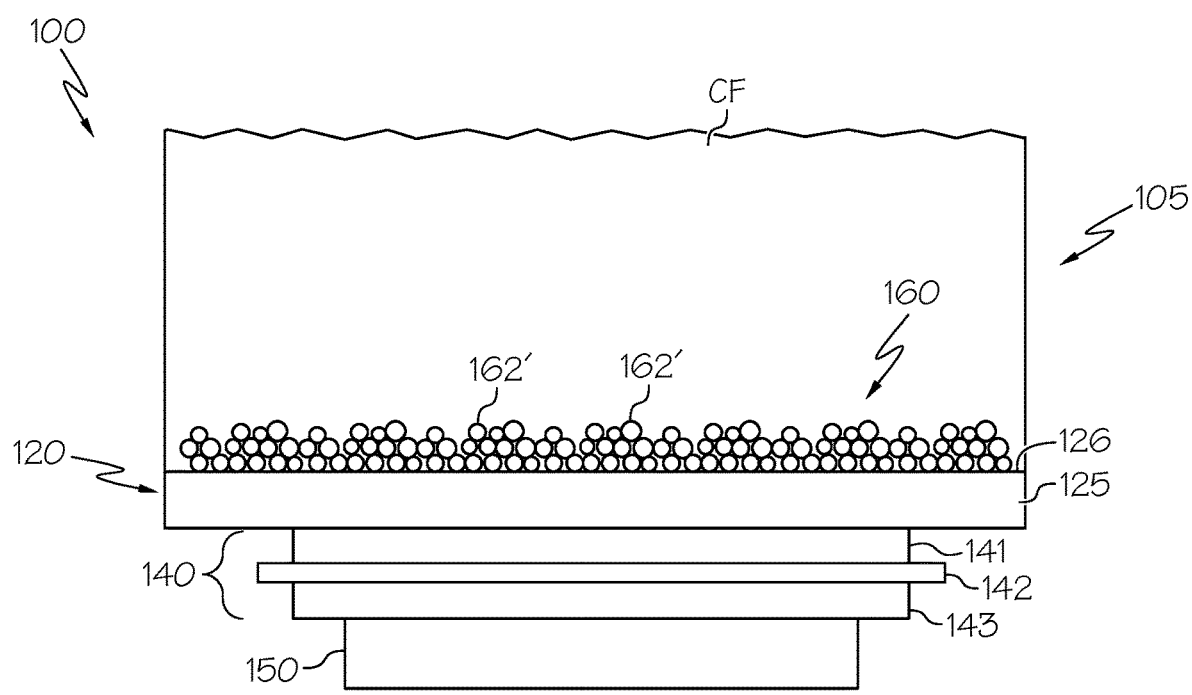
FIG. 1 schematically depicts a power electronics module comprising a porous metal foam layer transient liquid phase (TLP) bonded to a heat transfer surface for enhanced cooling of a semiconductor device according to one or more embodiments described and illustrated herein.

Referring now to FIG. 1, a power electronics module 100 comprising a cooling apparatus 105 (e.g., a cold plate) coupled to a substrate assembly 140 and a semiconductor device 150 is schematically illustrated. Semiconductor devices may include, but are not limited to, insulated gate bipolar transistors (IGBT), metal-oxide-semiconductor field effect transistors (MOSFET), power diodes, power bipolar transistors, power thyristor devices, and the like. As an example and not a limitation, the semiconductor device may be included in a power electronic module as a component in an inverter and/or converter circuit used to electrically power high load devices, such as electric motors in electrified vehicles (e.g., hybrid vehicles, plug-in hybrid electric vehicles, plug-in electric vehicles, and the like). The cooling apparatuses described herein may also be used to cool heat generating devices other than semiconductor devices (e.g., mechanical devices, such as motors).

In the illustrated embodiment, the semiconductor device 150 is thermally coupled to an intermediate substrate assembly 140. The illustrated substrate assembly 140 may comprise an insulating dielectric layer 142 disposed between two metal layers 141, 143. The substrate assembly 140 may comprise a direct bonded substrate assembly, such as a direct bonded copper assembly or a direct bonded aluminum assembly. Exemplary materials for the insulating dielectric layer 142 include, but are not limited to, alumina, aluminum nitride, silicon nitride, silicon carbide, and beryllium oxide. In alternative embodiments, only one metal layer may be provided. In yet other embodiments, the semiconductor device 150 is directly bonded to the cooling apparatus 105 (e.g., at a metal substrate 125).

The cooling apparatus 105 includes a porous metal foam layer 160 thermally bonded to a heat transfer surface 126 of the metal substrate 125 that enhances convective cooling of the heat transfer surface 126 as described in greater detail below. A cooling fluid CF may be in contact with the porous metal foam layer 160. In embodiments, the porous metal foam layer 160 comprises a plurality of composite particles 162' bonded together to form the porous metal foam layer 160. In some embodiments, the plurality of composite particles 162' may be bonded together via transient liquid phase (TLP) bonding. Also, the porous metal foam layer 160 may be bonded to the metal substrate 125 via TLP bonding.

Figure 2:
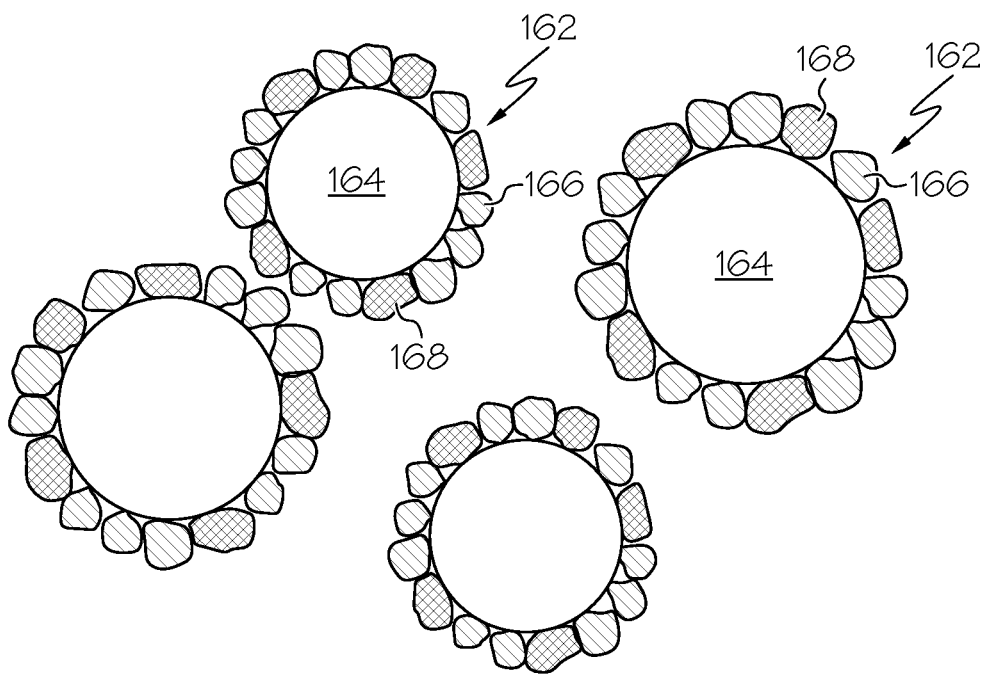
FIG. 2 schematically depicts a cross sectional view of a plurality of composite particles used to form the porous metal foam layer in FIG. 1 according to one or more embodiments described and illustrated herein.
Figure 3:
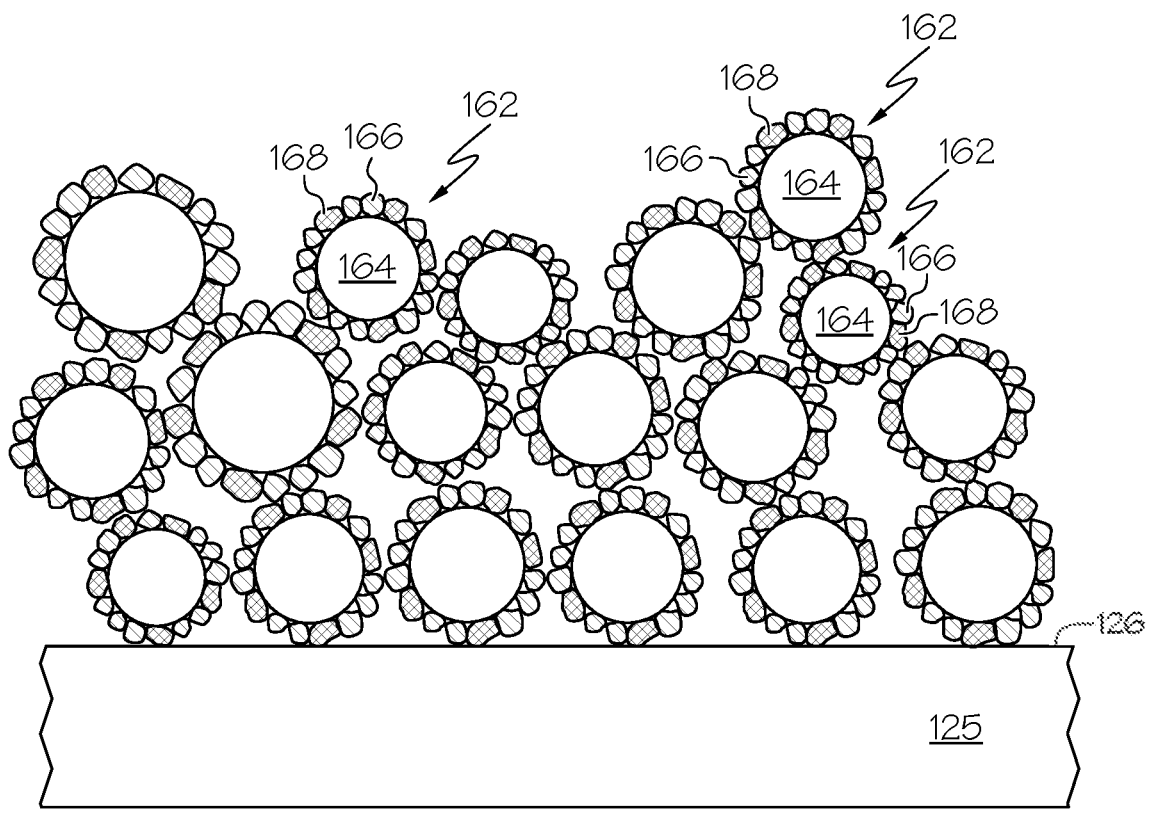
FIG. 3 schematically depicts an cross sectional view of a plurality of composite particles in FIG. 2 on the heat transfer surface in FIG. 1 prior to forming a porous metal foam layer according to one or more embodiments described and illustrated herein.

Referring now to FIGS. 2 and 3, a plurality of composite particles 162 prior to TLP sintering used to form the plurality of composite particles 162' and the porous metal foam layer 160 are depicted in FIG. 2. A layer of the composite particles 162 positioned on the heat transfer surface 126 of the metal substrate 125 prior to TLP sintering is depicted in FIG. 3. Each of the plurality of composite particles 162 include a first high melting temperature (HMT) particle 164 coated with a plurality of second HMT particles 166 and a plurality of low melting temperature (LMT) particles 168. It should be understood that not all of the composite particles 162 are numbered for clarity and ease of illustration. It should also be understood that the plurality of first HMT particles 164 may not be spherical in shape and that they may take on arbitrary shapes, and the plurality of second HMT particles 166 and/or the plurality of LMT particles 168 may be spherical in shape.

The plurality of LMT particles 168 have a melting temperature that is lower than that of the first and second HMT particles 164, 166. Accordingly, the embodiment depicted in FIG. 2 provides for a plurality of composite particles 162 that bond with each other by melting and diffusion of the LMT particles 168 into the first and second HMT particles 164, 166, which creates a high-temperature intermetallic alloy bonding layer as described in greater detail below.

The example composite particles 162 illustrated in FIG. 2 provides for a composition that has a re-melting temperature that is greater than an initial melting temperature. As an example and not a limitation, the initial melting temperature (e.g., the bonding process temperature) may be less than about 250° C., while the re-melting temperature (e.g., a maximum operating temperature for a power semiconductor device bonded by the transient liquid phase composition) may be significantly higher.

The plurality of composite particles 162 may be configured as loose particles in the form of a powder. In other embodiments, the plurality of composite particles 162 may be configured as a paste, wherein the plurality of composite particles 162 are disposed in an inorganic binder. In the alternative or in addition to, the plurality of composite particles 162 may be disposed in an organic binder.

Example materials for the first HMT particles 164 include without limitation nickel (Ni), silver (Ag), copper (Cu), aluminum (Al) and alloys thereof. Example materials for the second HMT particles 166 include without limitation Ni or Ag. In embodiments, the first HMT particles 164 and the second HMT particles 166 are formed from different materials. In other embodiments, the first HMT particles 164 and the second HMT particles 166 are formed from the same material. Example materials for the LMT particles 168 include without limitation tin (Sn), indium (In) and alloys thereof. As used herein, the term "alloys thereof" does not limit alloys formed from only the elements listed unless stated otherwise. For example, the LMT particles 168 may be formed from Sn, In, alloys of Sn containing elements other than In, alloys of Sn containing elements in addition to In, alloys of In containing elements other than Sn, or alloys of In containing elements in addition to Sn. In the alternative, the LMT particles 168 may be formed from alloys containing only Sn and In, and possibly incidental impurities present resulting from the manufacture of the Sn—In alloy(s).

Any known or yet-to-be-developed techniques may be utilized to fabricate the composite particles 162 described herein. As non-limiting examples, the composite particles 162 described herein may be fabricated from mechanical mixing of the first HMT particles 164 with the second HMT particles 166 and LMT particles 168 with additives such as binding agents, adhesive agents, and the like, such that the second HMT particles 166 and LMT particles adhere to the surface of the first HMT particles 164 as depicted in FIG. 2.

The material for the first HMT particles 164 may be chosen to achieve desirable mechanical, thermal and/or fabrication properties of the porous metal foam layer 160. For example, the material for the first HMT particles 164 may be chosen to increase the ductility of the porous metal foam layer 160, thereby resulting in a less brittle layer. In the alternative, or in addition to, the material of the first HMT particles 164 may be chosen to increase or decrease the thermal conductivity of the porous metal foam layer 160. Also, material of the first HMT particles 164 may be chosen to reduce a TLP sintering time for forming the porous metal foam layer 160 via TLP bonding. Accordingly, the first HMT particles described herein may be useful in forming compact heat exchangers for power electronics applications (e.g., a compact heat exchanger for a power semiconductor device in an inverter circuit of a hybrid or electric vehicles) because they have a high melting temperature (e.g., greater than 450° C.). It should be understood that the porous metal foam layers described herein may be utilized in applications other than power electronics applications, and may be used to enhance convective cooling for heat sources not disclosed and discussed herein.

In one non-limiting example, the first HMT particles 164 are made from Al, the second HMT particles 166 are made from Ni, and the LMT particles 168 are made from Sn. In another non-limiting example, the first HMT particles 164 are made from Cu, the second HMT particles 166 are made from Ni, and the LMT particles 168 outer shell are made from Sn. In yet another non-limiting example, the first HMT particles 164 are made from Cu, the second HMT particles 166 are made from Ag, and the LMT particles 168 are made from Sn.

The concentration of the plurality of composite particles 162 may be chosen to achieve desired mechanical and physical properties of the porous metal foam layer 160. For example, the concentration of the LMT particles 168 provides a porous metal foam layer 160 with a desired porosity and plurality of micro-channels to aid in the convective flow of a cooling fluid from an outer surface 161 (FIG. 4) of the porous metal foam layer 160 to the heat transfer surface 126 of the metal substrate 125. In embodiments, the plurality of composite particles 162 contain between about 20 weight percent (wt %) Sn and about 40 wt % Sn. In some embodiments, the plurality of composite particles 162 contain between about 25 wt % Sn and about 35 wt % Sn.

The average diameter of the first HMT particles 164 and the second HMT particles 166 may be chosen to achieve desired flow characteristics of a cooling fluid through the porous metal foam layer 160. For example, the average diameter of the first HMT particles 164 may be between about 2 micrometers (μm) to about 40 μm, and the average diameter of the second HMT particles 166 is between about 1 μm to about 10 μm. In some embodiments, the average diameter of the first HMT particles 164 is between about 3 μm to about 30 μm and the average diameter of the second HMT particles 166 is between about 1 μm to about 7 μm. In such embodiments, the average diameter of the first HMT particles 164 may be between about 5 μm to about 20 μm and the average diameter of the second HMT particles 166 may be between about 1 μm to about 5 μm.

The average diameter of the LMT particles 168 may be chosen to achieve flow properties of the LMT material during TLP sintering, intermetallic bonding layer properties and concentration of the LMT particles 168 relative to the overall concentration of the composite particles 162. For example, the average diameter of the LMT particles 168 may be between about 1 μm and about 10 μm. In some embodiments, the average diameter of the LMT particles 168 is between about 1 μm and about 7 μm. In such embodiments, the average diameter of the LMT particles 168 may be between about 1 μm and about 5 μm.

The combination of the first HMT particles 164 and the second HMT particles 166 in the porous metal foam layer 160 described herein may increase the ductility of the resulting porous metal foam layer over a TLP formed porous metal foam layer that includes only the first HMT particles 164 or only the second HMT particles 166. Accordingly, the resulting porous metal foam layer 160 may have a ductility that is desirable in power semiconductor applications, such as SiC semiconductor device applications, where there is a high operating temperature and a need for ductile convective cooling layers that will not crack during heating from ambient temperature to the operating temperature, during operation at the operating temperature, or during cooling from the operating temperature to ambient temperature.

Referring now to FIG. 4, the porous metal foam layer 160 formed from the plurality of composite particles 162 is depicted. Particularly, FIG. 4 depicts the porous metal foam layer 160 having been formed via TLP sintering in which the LMT particles 168 have at least partially melted and formed a TLP intermetallic bond layer between adjacent composite particles 162' and between a subset of the plurality of composite particles 162' and the heat transfer surface 126 of the metal substrate 125. FIG. 4A depicts two adjacent second HMT particles 166 bonded to each other via a first TLP intermetallic layer 170. That is, the first TLP intermetallic layer 170 is positioned between and TLP bonds adjacent second HMT particles to each other. FIG. 4B depicts a second HMT particle bonded to the heat transfer surface 126 via a second TLP intermetallic layer 172 and bonded to a first HMT particle 164 via a third TLP intermetallic layer 174. That is, a subset of the composite particles 162' are bonded to the heat transfer surface 126 via: (a) at least one second HMT particle 166 positioned between a first HMT particle 164 and the heat transfer surface 126; (b) a second TLP intermetallic layer 172 positioned between and bonding together the at least one second HMT particle 166 and the heat transfer surface 126; and (c) a third TLP intermetallic bonding layer positioned between and bonding together the at least one second HMT particle 166 to the first HMT particle 164. FIG. 4C depicts two first HMT particles bonded to each other via adjacent second HMT particles 166 that are bonded to the first HMT particles 164 being bonded to each other. That is, the two first HMT particles 164 are bonded to each other via third TLP intermetallic layers 174 positioned between and bonding together at least one second HMT particle 166 to each of the first HMT particles 164, and a first TLP intermetallic layer 170 positioned between and bonding together adjacent second HMT particles 166 such that at least one of the adjacent second HMT particles 166 is bonded to one the first HMT particles 164 and another one of the adjacent second HMT particles is bonded to another of the first HMT particles 164. Accordingly, first TLP intermetallic layers 170 TLP bond adjacent second HMT particles to each other, second TLP intermetallic layers 172 TLP bond second HMT particles 166 that are adjacent to the metal substrate 125 to the heat transfer surface 126, and third TLP intermetallic bonding layers TLP bond the second HMT particles 166 to each other to form the porous metal foam layer 160. It should be understood that the first TLP intermetallic layers 170, the second TLP intermetallic layers 172, and the third TLP intermetallic layers 174 may have the same chemical composition and/or microstructure. In the alternative, the first TLP intermetallic layers 170, the second TLP intermetallic layers 172, and the third TLP intermetallic layers 174 may not have the same chemical composition and/or microstructure. It should also be understood that the porous metal foam layer 160 may be formed at much lower sintering temperatures (e.g., between about 200° C. and about 300° C.) compared to diffusion bonding temperatures (e.g., about 800° C.) used to diffusion bond HMT particles together.

The porous metal foam layer 160 comprises porosity formed by pores, micro-channels, gaps between adjacent composite particles 162', and the like. Porosity within the porous metal foam layer 160 may be greater than 10 volume percent (vol %), greater than 20 vol %, greater than 30 vol %, greater than 40 vol %, or greater than 50 vol %, and less than 90 vol %, less than 80 vol %, less than 70 vol %, less than 60 vol %, less than 50 vol %, less than 40 vol %, or less than 30 vol %. In embodiments, the porosity within the porous metal foam layer is between about 10 vol % and about 90 vol %, for example between about 30 vol % and about 70 vol %. In some embodiments, the porosity within the porous metal foam layer is between about 30 vol % and about 70 vol %, for example between about 40 vol % and about 60 vol %.

The porous metal foam layer also comprises micro-channels extending from the outer surface 161 of the porous metal foam layer to the heat transfer surface 126 as depicted by the arrows '1' and '2' in FIG. 4. The micro-channels 1 and 2 provided a path for the cooling fluid CF to flow from the outer surface 161 of the porous metal foam layer 160 to the heat transfer surface 126. In embodiments, the flow channels 1, 2 wick the cooling fluid from the outer surface 161 of the porous metal foam layer 160 to the heat transfer surface thereby enhances the flow of the cooling fluid to the heat transfer surface 126. As used herein, the term "wick" and "wicking" refers to drawing or conveying a fluid through capillary action. As used herein, the term "capillary action" refers to flow of a liquid through a micro-channel due to adhesive and cohesive forces interacting between the liquid and a surface of the micro-channel. Accordingly, it should be understood that porosity in the porous metal foam layer 160 comprises the micro-channels that enable capillary action on the cooling fluid. In embodiments, the micro-channels have an average diameter between 5 μm and 1,000 μm. For example, the micro-channels may have an average diameter greater than 5 μm, greater than 10 μm, greater than 15 μm, greater than 20 μm, greater than 30 μm, greater than 40 μm, greater than 50 μm, greater than 75 μm, greater than 100 μm, or greater than 200 μm, and less than 1,000 μm, less than 750 μm, less than 500 μm, less than 250 μm, less than 150 μm, less than 100 μm, less than 75 μm or less than 50 μm. In some embodiments, the micro-channels have an average diameter between about 25 μm and about 200 μm, for example between about 40 μm and about 120 μm. In other embodiments, the micro-channels have an average diameter between about 40 μm and 150 μm, for example between about 50 μm and about 100 μm.

The heat transfer surface 126 may have a plurality of micro-boiling nucleation sites 127 between adjacent composite particles 162' and/or between adjacent second HMT particles 166. That is, area on the heat transfer surface 126 between the subset of composite particles 162' TLP bonded to the heat transfer surface 126 provide nucleation sites for boiling of the cooling fluid CF. Accordingly, the porous metal foam layer 160 TLP bonded to the metal substrate 125 enhances micro-boiling at the heat transfer surface 126 with vapor bubbles 'v' formed and flowing out towards the outer surface 161 through the micro-channels of the porous metal foam layer 160 as depicted by arrow 2 in FIG. 4.

The porous metal foam layer 160 enhances convective heat flow from the heat transfer surface 126. Particularly, the gaps, spaces, pores, etc., provide for the micro-channels 1, 2 extending from the outer surface 161 to the heat transfer surface 126. The micro-channels comprise an average inner diameter such capillary action is exerted on the cooling fluid CF such that the CF is wicked to the heat transfer surface 126. Also, composite particles 162' TLP bonded to the heat transfer surface 126 provide isolated small (micron sized) areas for boiling to occur on the heat transfer surface thereby resulting in the micro-boiling nucleation sites 127 for the CF to boil and form vapor 'v' (bubbles). The micro-channels 1,2 provide passageways for the vapor v to flow from the heat transfer surface 126 to the outer surface 161 of the porous metal foam layer 160. Such flow of vapor v from the micro-boiling nucleation sites 127 to the outer surface 161 of the porous metal foam layer 160 through micro-channels 1, 2 may be referred to as "flow boiling." It should be understood that flow boiling through micro-channels can provide high heat transfer rates compared to boiling in conventional heat exchangers.

Figure 5:
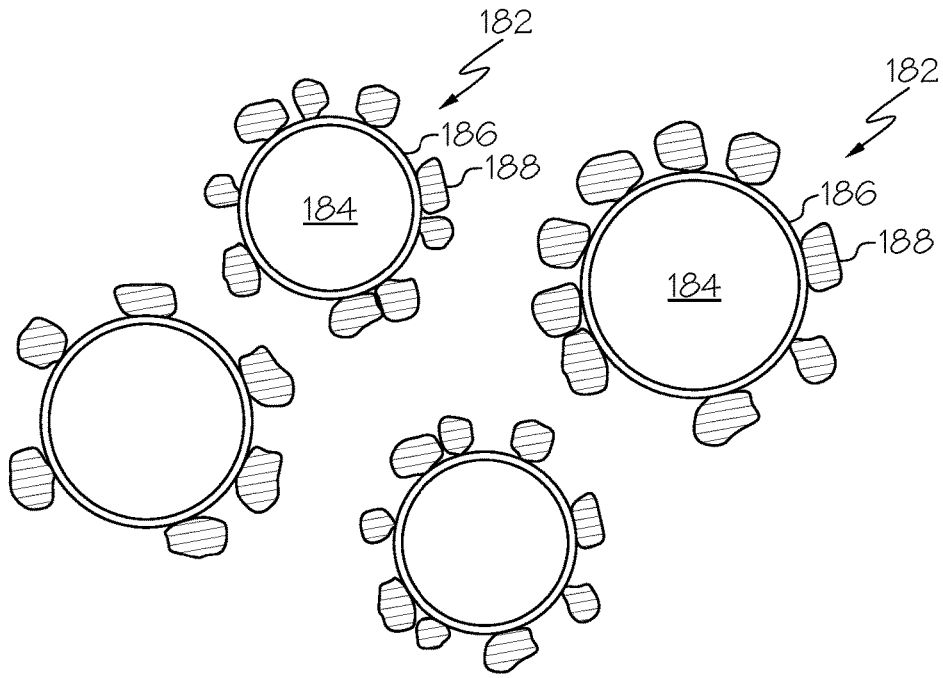
FIG. 5 schematically depicts a cross sectional view of a plurality of composite particles used to form the porous metal foam layer in FIG. 1 according to one or more embodiments described and illustrated herein.
Figure 6:
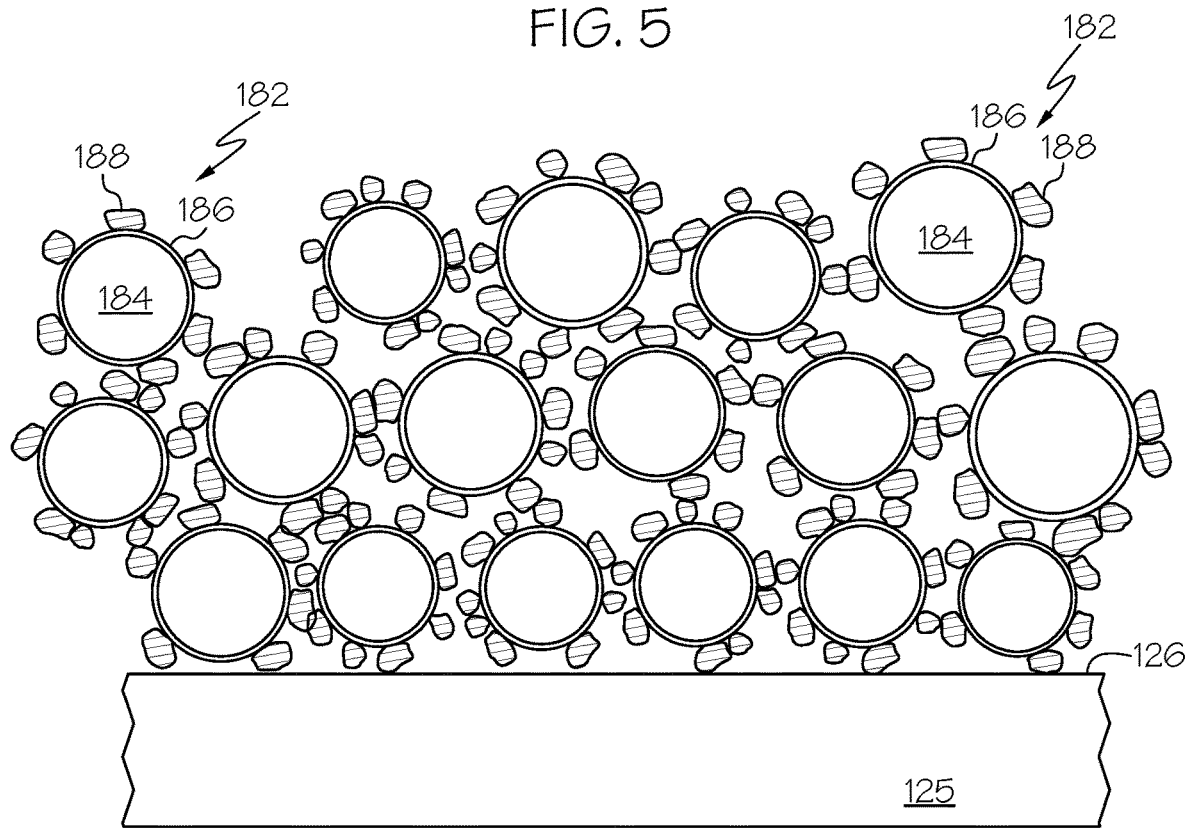
FIG. 6 schematically depicts a cross sectional view of a plurality of composite particles in FIG. 5 on the heat transfer surface in FIG. 1 prior to forming a porous metal foam layer according to one or more embodiments described and illustrated herein.

Referring now to FIGS. 5 and 6, embodiments of composite particles comprising core-shell particles with a first HMT core and a second HMT shell are depicted. Particularly, a plurality of composite particles 182 that form a plurality of composite particles 182' (FIG. 7) and a porous metal foam layer 180 (FIG. 7) are depicted in FIG. 5 and a layer of the composite particles 182 positioned on the heat transfer surface 126 of the metal substrate 125 prior to TLP sintering is depicted in FIG. 6. Each of the plurality of composite particles 182 include a first HMT core 184 coated with a layer of a second HMT material 186 (also referred to herein as a "second HMT shell 186") and a plurality of LMT particles 188. It should be understood that not all of the composite particles 182 are numbered for clarity and ease of illustration. It should also be understood that the plurality of first HMT cores 184 may not be spherical in shape and that they may take on arbitrary shapes and the plurality of LMT particles 188 may be spherical in shape.

Figure 7:
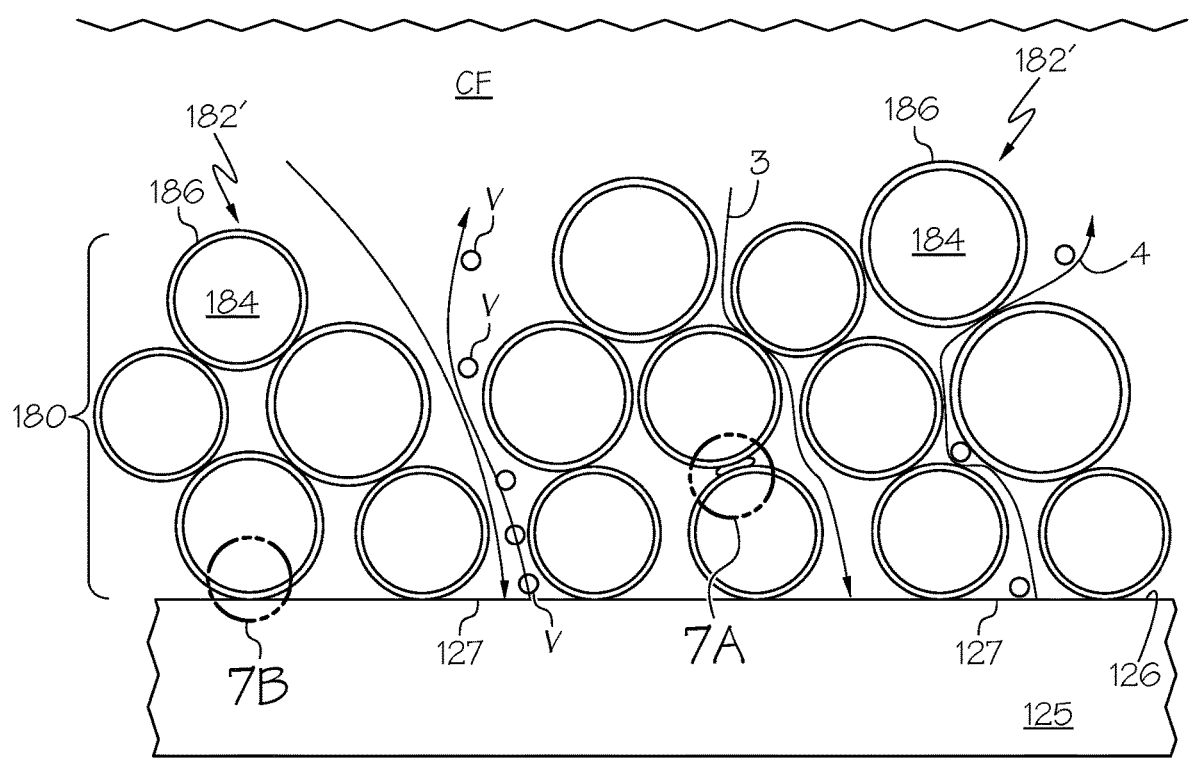
FIG. 7 schematically depicts a porous metal foam layer formed from the plurality of composite particles in FIG. 6 with the porous metal foam layer TLP bonded to the heat transfer surface in FIG. 1 according to one or more embodiments described and illustrated herein.

The plurality of LMT particles 188 have a melting temperature that is lower than that of the first HMT core 184 and second HMT shell 186. Accordingly, the embodiment depicted in FIG. 5 provides for a plurality of composite particles 182' that bond with each other by melting and diffusion of the LMT particles 188 into the second HMT shells 186 to form a TLP intermetallic layer between adjacent composite particles 182 (FIG. 7). Also, the LMT particles 188 form a TLP intermetallic layer between a subset of the composite particles 182' and the heat transfer surface 126 (FIG. 7) as described in greater detail below.

The example composite particles 182 illustrated in FIG. 5 provides for a composition that has a re-melting temperature that is greater than an initial melting temperature. As an example and not a limitation, the initial melting temperature (e.g., the bonding process temperature) may be less than about 250° C., while the re-melting temperature (e.g., a maximum operating temperature for a power semiconductor device bonded by the transient liquid phase composition) may be significantly higher.

The plurality of composite particles 182 may be configured as loose particles in the form of a powder. In other embodiments, the plurality of composite particles 182 may be configured as a paste, wherein the plurality of composite particles 182 are disposed in an inorganic binder. In the alternative or in addition to, the plurality of composite particles 182 may be disposed in an organic binder.

Example materials for the first HMT cores 184 include without limitation Ni, Ag, Cu, Al and alloys thereof. Example materials for the second HMT shells 186 include without limitation Ni or Ag. Example materials for the LMT particles 188 include without limitation Sn, In, and alloys thereof.

Any known or yet-to-be-developed technique may be utilized to fabricate the composite particles 182 described herein. As non-limiting examples, the first HMT cores 184 coated with the second HMT shells described herein may be fabricated from electroplating, electroless plating, and other water-based processes and the composite particles 182 may be fabricated from mechanical mixing of the first HMT cores 184 coated with the second HMT shells 186 with LMT particles 188. In embodiments, the first HMT cores 184 coated with the second HMT shells 186 may be mixed with the LMT particles 188 and additives such as binding agents, adhesive agents, and the like, such that the LMT particles 188 adhere to the surface of the second HMT shells 186 as depicted in FIG. 5.

The material for the first HMT cores 184 may be chosen to achieve desirable mechanical, thermal and/or fabrication properties of the porous metal foam layer 180. For example, the material for the first HMT cores 184 may be chosen to increase the ductility of the porous metal foam layer 180, thereby resulting in a less brittle layer. In the alternative, or in addition to, the material of the first HMT cores 184 may be chosen to increase or decrease the thermal conductivity of the porous metal foam layer 180. Accordingly, the first HMT particles described herein may be useful in forming compact heat exchangers for power electronics applications (e.g., a compact heat exchanger for a power semiconductor device in an inverter circuit of a hybrid or electric vehicles) because they have a high melting temperature (e.g., greater than 450° C.). It should be understood that the porous metal foam layers described herein may be utilized in applications other than power electronics applications, and may be used to enhance convective cooling for any heat source.

In one non-limiting example, the first HMT cores 184 are made from Al, the second HMT shells 186 are made from Ni, and the LMT particles 188 are made from Sn. In another non-limiting example, the first HMT cores 184 are made from Cu, the second HMT shells 186 are made from Ni, and the LMT particles 188 outer shell are made from Sn. In yet another non-limiting example, the first HMT cores 184 are made from Cu, the second HMT shells 186 are made from Ag, and the LMT particles 188 are made from Sn.

The concentration of the plurality of composite particles 182 may be chosen to achieve desired mechanical and physical properties of the porous metal foam layer 180. For example, the concentration of the LMT particles 188 provides a porous metal foam layer 180 with a desired porosity and plurality of micro-channels to aid in the convective flow of a cooling fluid from an outer surface 181 (FIG. 7) of the porous metal foam layer 180 to the heat transfer surface 126 of the metal substrate 125. In embodiments, the plurality of composite particles 182 contain between about 20 weight percent (wt %) Sn and about 40 wt % Sn. In some embodiments, the plurality of composite particles 162 contain between about 25 wt % Sn and about 35 wt % Sn.

The average diameter of the first HMT cores 184 and the average thickness of the second HMT shells 186 may be chosen to achieve desired flow characteristics of a cooling fluid through the porous metal foam layer 180. For example, the average diameter of the first HMT cores 184 may be between about 2 micrometers (μm) to about 40 μm and the average thickness of the second HMT shells 186 may be between about 1 μm to about 10 μm. In some embodiments, the average diameter of the first HMT cores 184 is between about 3 μm to about 30 μm and the average thickness of the second HMT shells 186 is between about 1 μm to about 7 μm. In such embodiments, the average diameter of the first HMT cores 184 may be between about 5 μm to about 20 μm and the average thickness of the second HMT shells 186 may be between about 1 μm to about 5 μm.

The average diameter of the LMT particles 188 may be chosen to achieve flow properties of the LMT material during TLP sintering, intermetallic bonding layer properties and concentration of the LMT particles 188 relative to the overall concentration of the composite particles 182. For example, the average diameter of the LMT particles 188 may be between about 1 μm and about 10 μm. In some embodiments, the average diameter of the LMT particles 188 is between about 1 μm and about 7 μm. In such embodiments, the average diameter of the LMT particles 188 may be between about 1 μm and about 5 μm.

The combination of the first HMT cores 184 and the second HMT shells 186 in the porous metal foam layer 180 described herein may increase the ductility of the resulting porous metal foam layer over a TLP formed porous metal foam layer that includes only the first HMT cores 184. Accordingly, the resulting porous metal foam layer 180 may have a ductility that is desirable in power semiconductor applications, such as SiC semiconductor device applications, where there is a high operating temperature and a need for ductile convective cooling layers that will not crack during heating from ambient temperature to the operating temperature, during operation at the operating temperature, or during cooling from the operating temperature to ambient temperature. Also, the inclusion of the second HMT shells 186 may assist in providing a more stable intermetallic TLP bonding layer and a reduced sintering time for the porous metal foam layer 180 as described above with respect to the second HMT particles 166.

Figure 7A:
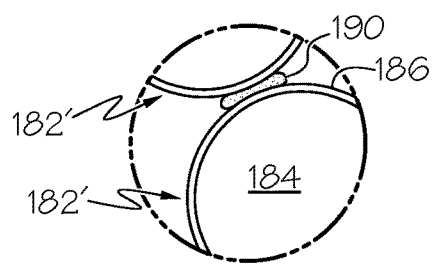
FIG. 7A schematically depicts an enlarged view of section 7A in FIG. 7.
Figure 7B:
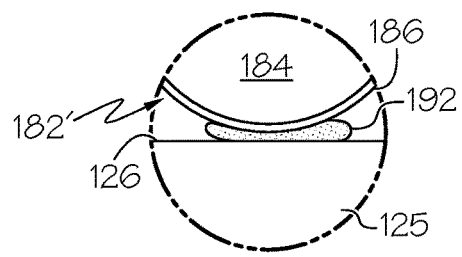
FIG. 7B schematically depicts an enlarged view of section 7B in FIG. 7.

Referring now to FIG. 7, the porous metal foam layer 180 formed from the plurality of composite particles 182 is depicted. Particularly, FIG. 7 depicts the porous metal foam layer 180 having been formed via TLP sintering in which the LMT particles 188 have at least partially melted and formed a TLP intermetallic bond layer between adjacent composite particles 182' and between a subset of the plurality of composite particles 182' and the heat transfer surface 126 of the metal substrate 125. For example, FIG. 7A depicts adjacent composite particles 182' bonded to each other via a first TLP intermetallic layer 190. That is, the first TLP intermetallic layer 190 is positioned between and TLP bonds adjacent composite particles 182' to each other. FIG. 7B depicts a composite particle 182' bonded to the heat transfer surface 126 via a second TLP intermetallic layer 192. That is, the second TLP intermetallic layer 192 is positioned between and bonds together a subset of the composite particles 182' and the heat transfer surface 126. Accordingly, first TLP intermetallic layers 190 TLP bond adjacent composite particles 182' to each other to form the porous metal foam layer 180 and the second TLP intermetallic layers 192 TLP bond composite particles 182' that are adjacent to the metal substrate 125 to the heat transfer surface 126 to thermally bond the porous metal foam layer 180 to the heat transfer surface 126.

The porous metal foam layer 180 comprises porosity formed by pores, micro-channels, gaps between adjacent composite particles 182', and the like. Porosity within the porous metal foam layer 180 may be greater than 10 volume percent (vol %), greater than 20 vol %, greater than 30 vol %, greater than 40 vol %, or greater than 50 vol %, and less than 90 vol %, less than 80 vol %, less than 70 vol %, less than 60 vol %, less than 50 vol %, less than 40 vol %, or less than 30 vol %. In embodiments, the porosity within the porous metal foam layer 180 is between about 10 vol % and about 90 vol %, for example between about 30 vol % and about 70 vol %. In some embodiments, the porosity within the porous metal foam layer is between about 30 vol % and about 70 vol %, for example between about 40 vol % and about 60 vol %.

The porous metal foam layer also comprises micro-channels extending from the outer surface 181 of the porous metal foam layer to the heat transfer surface 126 as depicted by the arrows '3' and '4' in FIG. 7. The micro-channels 3, 4 provide a path for a cooling fluid CF to flow from the outer surface 181 of the porous metal foam layer 180 to the heat transfer surface 126. In embodiments, the micro-channels 3, 4 wick the cooling fluid from the outer surface 181 of the porous metal foam layer 180 to the heat transfer surface 126 thereby enhancing the flow of the cooling fluid CF to the heat transfer surface 126. In embodiments, the micro-channels have an average diameter between 5 μm and 1,000 μm. For example, the micro-channels may have an average diameter greater than 5 μm, greater than 10 μm, greater than 15 μm, greater than 20 μm, greater than 30 μm, greater than 40 μm, greater than 50 μm, greater than 75 μm, greater than 100 μm, or greater than 200 μm, and less than 1,000 μm, less than 750 μm, less than 500 μm, less than 250 μm, less than 150 μm, less than 100 μm, less than 75 μm or less than 50 μm. In some embodiments, the micro-channels have an average diameter between about 25 μm and about 200 μm, for example between about 40 μm and about 120 μm. In other embodiments, the micro-channels have an average diameter between about 40 μm and 150 μm, for example between about 50 μm and about 100 μm.

The heat transfer surface 126 may have a plurality of micro-boiling nucleation sites 127 between adjacent composite particles 182'. That is, area between the subset of composite particles 182' TLP bonded to the heat transfer surface 126 provide nucleation sites for boiling of the cooling fluid CF. Accordingly, the porous metal foam layer 180 TLP bonded to the metal substrate 125 enhances micro-boiling at the heat transfer surface 126 with vapor bubbles 'v' formed and flowing out towards the outer surface 181 of the porous metal foam layer 180 through the micro-channels 3, 4 depicted in FIG. 7.

The porous metal foam layer 180 enhances convective heat flow from the heat transfer surface 126. Particularly, the gaps, spaces, pores, etc., provide for the micro-channels 3, 4 extending from the outer surface 181 to the heat transfer surface 126. The micro-channels 3, 4 comprise an average inner diameter such that capillary action is exerted on the cooling fluid CF and the CF is wicked to the heat transfer surface 126. Also, composite particles 182' TLP bonded to the heat transfer surface 126 provide isolated small (micron sized) areas for boiling to occur on the heat transfer surface thereby resulting in the micro-boiling nucleation sites 127 for the CF to boil and form vapor 'v' (bubbles). The micro-channels 3, 4 provide passageways for the vapor v to flow from the heat transfer surface 126 to the outer surface 181 of the porous metal foam layer 180 (flow boiling). As noted above, flow boiling through micro-channels can provide high heat transfer rates compared to boiling in conventional heat exchangers.

Figure 8:
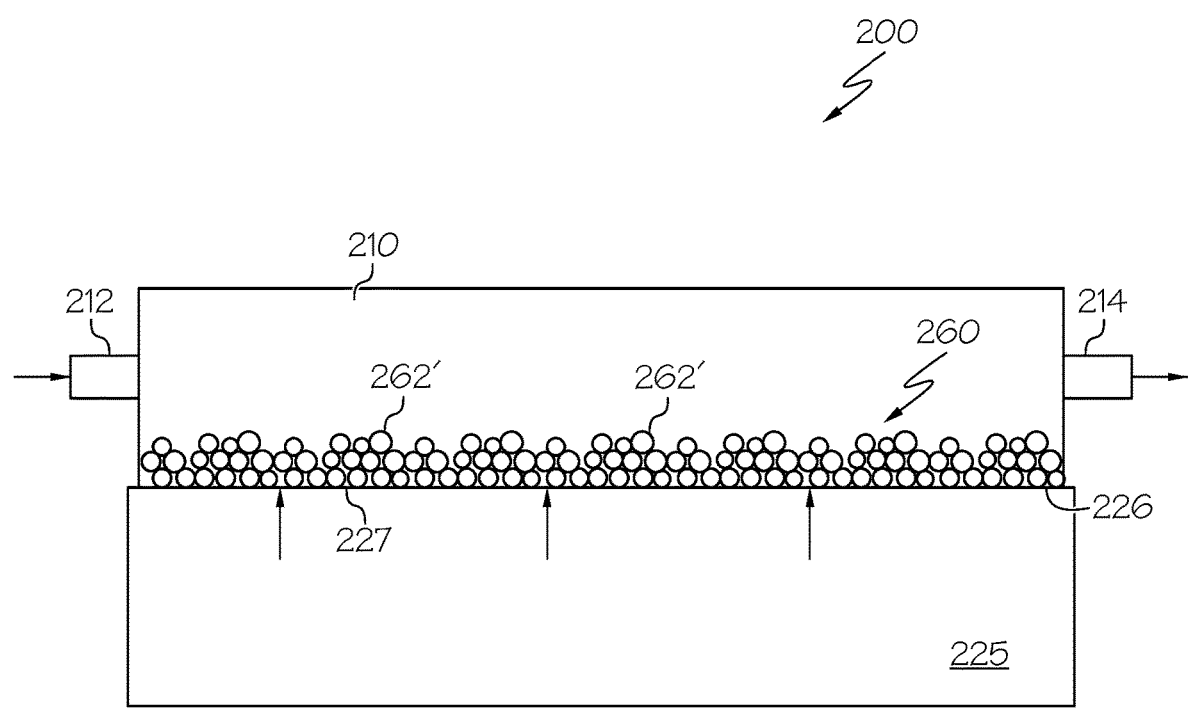
FIG. 8 schematically depicts a cross-sectional view of a heat exchanger according to one or more embodiments described and illustrated herein.

While FIG. 1 depicts a porous metal foam layer for use with semiconductor power devices, it should be understood that porous metal foam layers described herein may be used in other heat transfer applications. For example, FIG. 8 depicts a heat exchanger 200 with a fin 225 and a flow channel 210. For example and without limitation, heat exchanger 200 may be a shell and tube heat exchanger, a plate heat exchanger, a plate and shell heat exchanger, an adiabatic wheel heat exchanger, a plate fin heat exchanger, and the like. Fluid flows through the flow channel 210 from an inlet 212 to an outlet 214. A porous metal foam layer 260 is attached, e.g., TLP bonded to a heat transfer surface of the fin 225 and enhances convective heat flow from the fin 225 to the flow channel 210 via micro-channels and micro-boiling nucleation sites 227 on the heat transfer surface 226. It should be understood that the porous metal foam layer 260 may be TLP bonded to a plurality of heat transfer surfaces within a heat exchanger.

A process for forming the porous metal foam layer on a heat transfer surface includes applying a layer of a transient liquid phase (TLP) bonding paste onto a metal substrate. The TLP bonding paste includes a plurality of first HMT particles coated with a second HMT material and a LMT material. The metal substrate and TLP bonding paste are heated to a TLP sintering temperature (e.g., in a furnace). At the TLP sintering temperature, the LMT material at least partially melts and forms a first TLP intermetallic layer between adjacent first HMT particles and TLP bonds the plurality of first HMT particles together to form a porous metal foam layer. Also, the LMT material at least partially melts and forms a second TLP intermetallic layer between a subset of the plurality of first HMT particles and the metal substrate to TLP bond the porous metal foam layer to the metal substrate. It should be understood that the composite particles comprising first HMT particles coated with a second HMT material and a LMT material a disclosed and described herein provide for formation of porous metal foam layers at much lower sintering temperatures (e.g., between about 200° C. and about 300° C.) compared to diffusion bonding sintering temperatures (e.g., about 800° C.) currently used to bond HMT particles to form porous metal layers. Accordingly, components to which porous metal foam layers are bonded to are exposed to much lower sintering temperatures during fabrication of the TLP bonded porous metal foam layers.

It should now be understood that embodiments described herein are directed to cooling apparatuses with a porous metal foam layer for convective cooling of heat generating devices. The porous metal foam layers are TLP bonded to a heat transfer surface and comprise micro-channels that wick a cooling fluid to the heat transfer surface. The micro-channels also provide passageways for vapor formed from boiling of the cooling fluid at the heat transfer surface to flow to an outer surface of the porous metal foam layer thereby enhancing heat transfer from a heat generating device.

Directional terms as used herein—for example up, down, right, left, front, back, top, bottom, vertical, horizontal—are made only with reference to the figures as drawn and are not intended to imply absolute orientation unless otherwise expressly stated.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A heat transfer surface with a convective cooling layer comprising:
    a metal substrate; and
    a porous metal foam layer comprising:
        a plurality of first high melting temperature (HMT) particles coated with a plurality of second HMT particles, and a plurality of micro-channels, wherein:
            the plurality of first HMT particles comprise a first HMT material and have an average particle diameter of from 6 μm to 40 μm; and
            the plurality of second HMT particles comprise a second HMT material and have an average particle diameter of from 1 μm to 5 μm;
        a first TLP intermetallic bond positioned between and TLP bonding together adjacent first HMT particles, second HMT particles, or both, to form the porous metal foam layer; and
        a second TLP intermetallic bond positioned between a subset of the plurality of first HMT particles, a subset of the plurality of second HMT particles, or both, to the metal substrate such that the porous metal foam layer is TLP bonded to the metal substrate by the second TLP intermetallic bond;
    wherein the plurality of micro-channels extend from an outer surface of the porous metal foam layer to the metal substrate for a cooling fluid to be wicked through the plurality of micro-channels to the surface of the metal substrate.

2. The heat transfer surface of claim 1, wherein the second HMT material is different than the first HMT material.

3. The heat transfer surface of claim 1, further comprising a third TLP intermetallic bond positioned between and TLP bonding the plurality of second HMT particles to the plurality of first HMT particles.

4. The heat transfer surface of claim 1, wherein the first TLP intermetallic bond is positioned between and bonds together a second HMT particle TLP bonded to a first HMT particle and an adjacent second HMT particle TLP bonded to another first HMT particle such that the first HMT particle and the another first HMT particle are TLP bonded together via the second HMT particle being TLP bonded to the adjacent second HMT particle.

5. The heat transfer surface of claim 1, wherein:
    a subset of the plurality of second HMT particles are positioned between the metal substrate and a subset of the plurality of first HMT particles;

the first TLP intermetallic bond is positioned between and TLP bonds the subset of the plurality of first HMT particles to the subset of the plurality of second HMT particles; and the second TLP intermetallic bond is positioned between and TLP bonds the subset of the plurality of second HMT particles to the metal substrate such that the subset of the plurality of first HMT particles are TLP bonded to the metal substrate.

6. The heat transfer surface of claim 1, wherein the plurality of first HMT particles are formed from copper, nickel, silver, aluminum or alloys thereof, and the plurality of second HMT particles are formed from nickel, silver or alloys thereof.

7. The heat transfer surface of claim 1, wherein the metal substrate comprises a plurality of micro-boiling nucleation sites between the subset of the first HMT particles, the subset of second HMT particles, or both, TLP bonded to the metal substrate.

8. The heat transfer surface of claim 1, wherein the first TLP intermetallic bond and the second TLP intermetallic bond comprise an intermetallic of tin.

9. The heat transfer surface of claim 1, wherein the porous metal foam layer has a concentration of tin between 20 wt % and 40 wt %.

10. The heat transfer surface of claim 9, wherein the concentration of tin is between 25 wt % and 35 wt %.

11. The heat transfer surface of claim 1, wherein:
at least one of the first HMT particles, the second HMT particles, or both, includes copper or aluminum;
at least one of the first HMT particles, the second HMT particles, or both, includes nickel or silver; and
wherein the first TLP intermetallic bond, the second TLP intermetallic bond, or both comprise a ternary intermetallic compound comprising tin, at least one of copper or aluminum, and at least one of nickel or silver.

12. The heat transfer surface of claim 1, wherein the plurality of first HMT particles are formed from a metal selected from the group consisting of copper, nickel, silver, aluminum, or combinations of these, and the plurality of second HMT particles are formed from a metal selected from the group consisting of nickel, silver, or nickel and silver.

13. The heat transfer surface of claim 1, wherein the first TLP intermetallic bond, the second TLP intermetallic bond, or both, comprise an alloy of an LMT material and at least one metal from the first HMT particles, the second HMT particles, or both.

14. A heat exchanger with a heat transfer surface, the heat exchanger comprising:
a cold plate comprising a metal substrate through which heat flows from a heat source to the cold plate;
a porous metal foam layer comprising:
a plurality of first high melting temperature (HMT) particles coated with a plurality of second HMT particles and a plurality of micro-channels, wherein:
the plurality of first HMT particles comprise a first HMT material and have an average particle diameter of from 6 μm to 40 μm; and
the plurality of second HMT particles comprise a second HMT material and have an average particle diameter of from 1 μm to 5 μm;
a first TLP intermetallic bond positioned between and TLP bonding together adjacent first HMT particles, second HMT particles, or both, to form the porous metal foam layer; and
a second TLP intermetallic bond positioned between and TLP bonding a subset of the plurality of first HMT particles, a subset of the plurality of second HMT particles, or both, to the metal substrate such that the porous metal foam layer is TLP bonded to the metal substrate;
wherein the plurality of micro-channels extend from an outer surface of the porous metal foam layer to the metal substrate such that a cooling fluid is wicked through the plurality of micro-channels to the surface of the metal substrate.

15. The heat exchanger of claim 14, wherein:
the second HMT material is different than the first HMT material; and wherein the heat exchanger further comprises
a third TLP intermetallic bond is positioned between and TLP bonds the plurality of second HMT particles to the plurality of first HMT particles.

* * * * *